United States Patent [19]

Lee et al.

[11] Patent Number: 4,541,105
[45] Date of Patent: Sep. 10, 1985

[54] COUNTING APPARATUS AND METHOD FOR FREQUENCY SAMPLING

[75] Inventors: Charles K. Lee, Seattle; Rex B. Peters, Woodinville; Aleksandar M. Gogic, Seattle, all of Wash.

[73] Assignee: Sundstrand Data Control, Inc., Redmond, Wash.

[21] Appl. No.: 592,657

[22] Filed: Mar. 23, 1984

[51] Int. Cl.³ ............................................. G01R 23/00
[52] U.S. Cl. ........................................ 377/19; 328/133
[58] Field of Search ................... 377/19, 39; 328/133, 328/151, 134, 136; 307/352, 516

[56] References Cited

U.S. PATENT DOCUMENTS

| | | | |
|---|---|---|---|
| 2,992,384 | 7/1961 | Malbrain | 324/78 |
| 3,296,539 | 1/1967 | Felix | 329/10.1 |
| 3,304,504 | 2/1967 | Horlander | 328/72 |
| 3,473,133 | 10/1969 | Hummel | 329/126 |
| 3,491,305 | 1/1970 | Stone | 329/126 |
| 3,524,131 | 8/1970 | McWaid | 324/78 |
| 3,546,607 | 12/1970 | Dixon | 329/126 |
| 3,548,328 | 12/1970 | Breikss | 329/126 |
| 3,568,078 | 3/1971 | Pelchat | 329/110 |
| 3,609,555 | 9/1971 | Blerkon | 325/349 |
| 3,670,250 | 6/1972 | Fritkin | 329/104 |
| 3,746,995 | 7/1973 | Schroeder et al. | 325/320 |
| 3,794,757 | 2/1974 | Knabe | 178/58 |
| 3,818,355 | 6/1974 | Ishigaki | 329/104 |
| 3,829,785 | 8/1974 | Schroder et al. | 328/130 |
| 3,859,512 | 1/1975 | Ritzinger | 235/151.3 |
| 3,878,470 | 4/1975 | Boltz, Jr. | 329/126 |
| 3,879,671 | 4/1975 | Yanagidaira et al. | 329/128 |
| 3,909,599 | 9/1975 | Trott, Jr. et al. | 235/151.3 |
| 3,909,714 | 9/1975 | Nakano | 324/78 |
| 3,909,716 | 9/1975 | Diekers | 324/78 |
| 3,924,183 | 12/1975 | Fletcher | 324/79 D |
| 3,968,434 | 7/1976 | Dixon et al. | 324/166 |
| 3,988,687 | 10/1976 | Asmussen | 328/167 |
| 3,997,764 | 12/1976 | Belmonte et al. | 235/92 |
| 4,020,418 | 4/1977 | Burrage | 324/78 |
| 4,021,744 | 3/1977 | Montefusco | 329/105 |
| 4,027,146 | 3/1977 | Gilmore | 235/151.3 |
| 4,052,676 | 10/1977 | Crittenden | 377/20 |
| 4,065,722 | 12/1977 | Francis | 329/105 |
| 4,073,432 | 2/1978 | Schröder | 235/92 |
| 4,090,145 | 3/1978 | Webb | 329/1 |
| 4,091,330 | 3/1978 | Hidaka | 329/107 |
| 4,107,600 | 8/1978 | McMannis | 324/78 |
| 4,150,432 | 4/1979 | Sorden | 364/484 |
| 4,224,568 | 9/1980 | Griner | 324/78 |
| 4,251,869 | 2/1981 | Shaffer | 364/484 |
| 4,310,800 | 1/1982 | Baker et al. | 324/78 |

OTHER PUBLICATIONS

IBM Technical Disclosure Bulletin, vol. 16, No. 11, Apr. 1974, p. 3747.

*Primary Examiner*—John S. Heyman
*Assistant Examiner*—K. Ohralik
*Attorney, Agent, or Firm*—Christensen, O'Connor, Johnson & Kindness

[57] ABSTRACT

An apparatus and method for counting the number of cycles of a sensor signal and of a reference signal that occur during respective time intervals associated with a sampling interval defined by a sample signal. Sensor and reference gate signals are produced and respectively define sensor and reference intervals. The sensor interval begins and ends synchronously with respect to the sensor signal, and the reference interval begins and ends synchronously with respect to the reference signal. The sensor, reference and sampling intervals are approximately coextensive with one another. Cycles of the sensor and reference signals are counted during the sensor and reference intervals, respectively. The process may be repeated for a plurality of successive sampling intervals.

16 Claims, 4 Drawing Figures

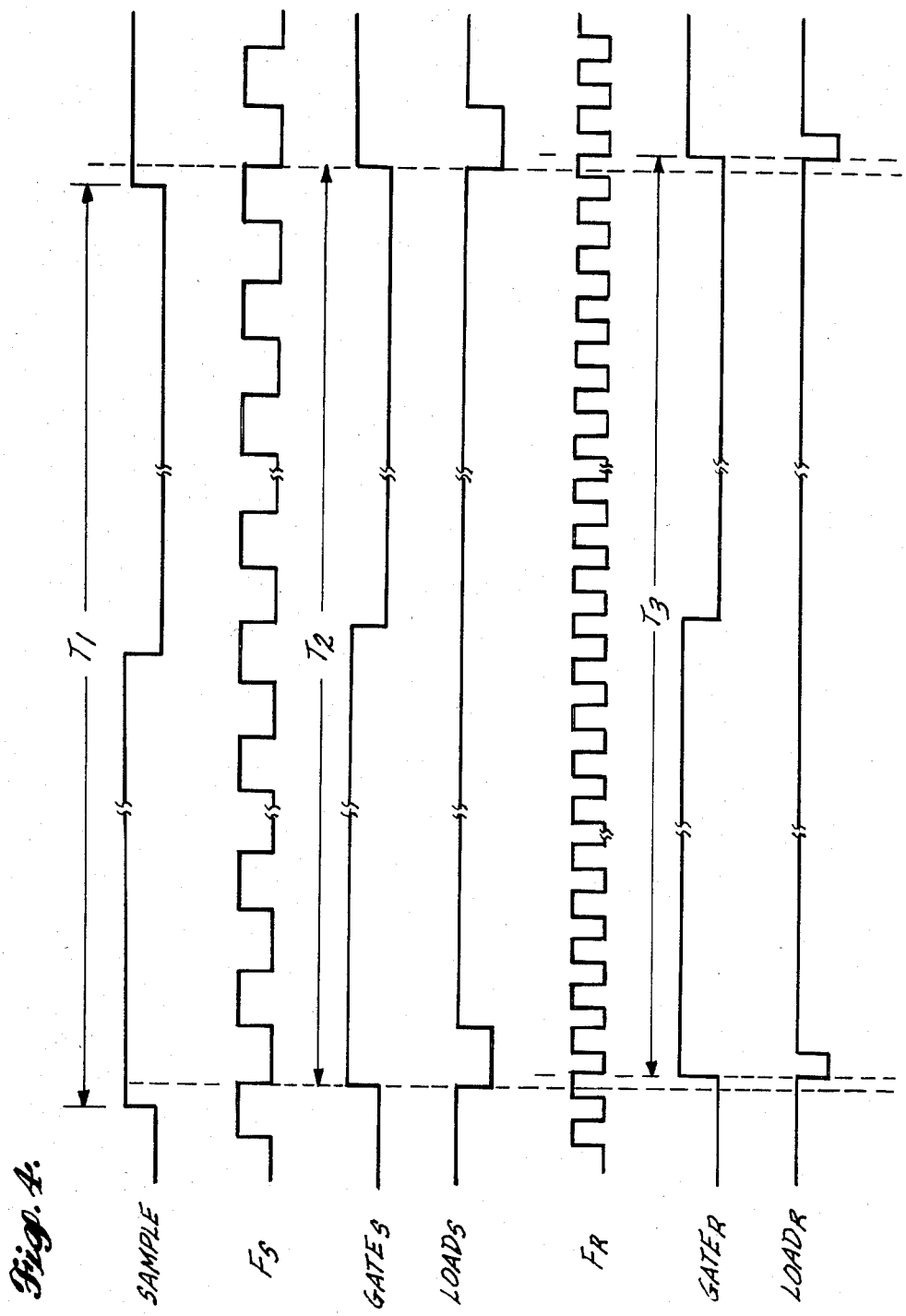

COUNTING APPARATUS AND METHOD FOR FREQUENCY SAMPLING

TECHNICAL FIELD

This invention relates to techniques for sampling the frequency of an input signal and for producing corresponding digital output signals.

BACKGROUND OF THE INVENTION

A common type of instrument is one in which a sensor produces a signal whose frequency is related in some functional way, often nonlinear, to a physical input variable. In order to use such a sensor in a digital system, the frequency of the sensor signal must be converted into a series of digital samples. The most versatile systems for measuring frequency operate either by counting cycles of the sensor or input signal for a known time interval, or by counting cycles of a reference signal for an interval controlled by the sensor signal. Using either technique, the resolution of such a frequency measurement depends on the number of counts that can be accumulated during the counting or sampling interval. The resolution may therefore be very poor at high sampling rates.

For wideband sensors such as accelerometers, sampling rates must often be much greater than would otherwise be required by system bandwidth requirements, in order to avoid errors due to frequency aliasing and input rectification. However, if resolution cannot be improved by digital low pass filtration, i.e., by averaging, substantial errors may be introduced by using high sample rates. With conventional frequency counting techniques counts are lost between adjacent sampling intervals, because the counters are reset for each sample. Therefore, with conventional frequency sampling methods, averaging several samples usually does not significantly improve the resolution.

SUMMARY OF THE INVENTION

The present invention provides a method and apparatus for counting the cycles of a sensor signal and of a reference signal in such a way that no sensor of reference counts are lost. The counting technique of the present invention therefore permits resolution to be improved by averaging counts over a plurality of successive sampling intervals.

A preferred embodiment of an apparatus according to the present invention comprises gating means, sensor count means, and reference count means. A sample signal is provided that is operative to define a sampling interval. The gating means is responsive to the sensor, reference and sample signals to produce a sensor gate signal and a reference gate signal. The sensor gate signal has a characteristic that is operative to define a sensor interval that begins and ends synchronously with respect to the sensor signal. The reference gate signal has a characteristic that is operative to define a reference interval that begins and ends synchronously with respect to the reference signal. The sensor, reference and sample intervals are approximately coextensive with one another. The sensor count means counts the numbers of cycles of the sensor signal that occur during the sensor interval, and the reference count means counts the number of cycles of the reference signal that occur during the reference interval. The relationship of the frequency of the sensor signal to the frequency of the reference signal may thereby be determined.

In a preferred method according to the present invention, a sensor gate signal and a reference gate signal are produced in response to the sample, sensor and reference signals. The sensor and reference gate signals have characteristics that are operative to define the sensor and reference intervals respectively, and the sensor and reference signals are respectively counted during such sensor and reference intervals.

In a further embodiment, the present invention comprises a sensor for producing a sensor signal having a frequency that corresponds to an input variable, means for producing the reference and sample signals, counting means for counting the number of cycles of the sensor and reference signals that occur during respective time intervals associated with the sampling interval and for producing corresponding digital sensor and reference count signals, and processor means for receiving the sensor and reference count signals and determining therefrom the value of the input variable. The processor means may be operative to average values associated with the sensor and reference count signals over successive sampling intervals.

These and other features and advantages of the invention will become apparent in the detailed description and claims to follow, taken in conjunction with the accompanying drawings.

BRIEF DESCRIPTION OF THE DRAWINGS

FIG. 4 is a timing diagram corresponding to the counting circuit of FIG. 3.

DETAILED DESCRIPTION OF THE INVENTION

Figure 1:
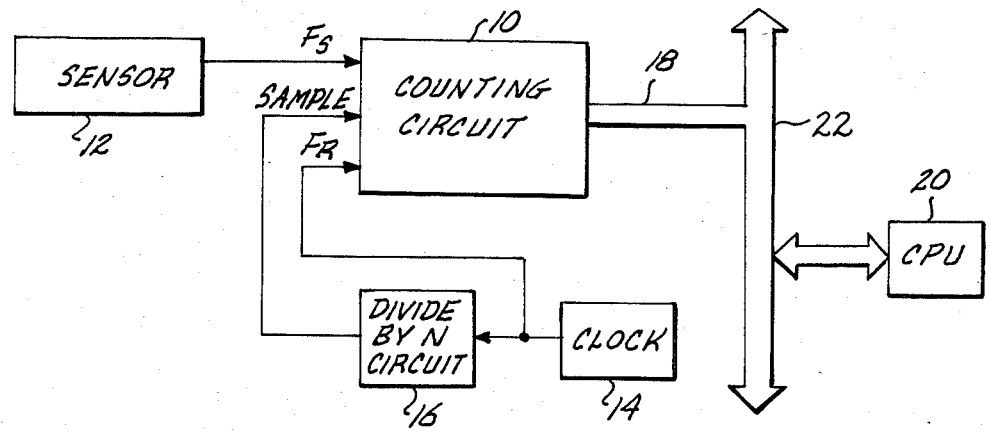
FIG. 1 is a block diagram of a device that includes a counting circuit according to the present invention.

Referring initially to FIG. 1, an instrument or device is shown that includes a counting circuit according to the present invention. The instrument includes sensor 12 that produces an output signal $F_S$ whose frequency is a function of the variable sensed or measured by the sensor. It is desired to sample the value of this variable by converting the frequency of $F_S$ into a series of digital signals usable by a data processing system comprising CPU 20. The conversion is carried out by counting circuit 10 of the present invention. The inputs to counting circuit 10 include sensor signal $F_S$, a SAMPLE signal, and a reference signal $F_R$. The SAMPLE signal defines a series of successive sampling intervals. During time periods associated with each sampling interval, counting circuit 10 counts the cycles of sensor signal $F_S$ and of reference signal $F_R$. At the end of the respective time periods, the accumulated counts are stored. During the next sampling interval, counting circuit 10 outputs digital signals corresponding to the stored counts onto system bus 18. The digital signals are utilized by CPU 20 to determine the value of the variable sensed by sensor 12. As discussed below, CPU 20 may also average values corresponding to successive sampling intervals to improve resolution.

Reference signal $F_R$ preferably comprises a periodic signal that has a frequency higher than that of sensor signal $F_S$. In the embodiment of FIG. 1, $F_R$ is a comparatively high frequency square wave signal provided by clock 14, and is asynchronous with respect to sensor signal $F_S$. The SAMPLE signal is a comparatively low frequency signal that operates to define the sampling intervals. In the embodiment shown in FIG. 1, SAMPLE is derived from $F_R$ by means of Divide by N Circuit 16, such that SAMPLE consists of a comparatively low frequency square wave signal. In the embodiment illustrated herein, each complete cycle of the SAMPLE signal defines one sampling interval, and the end of one sampling interval and the beginning of the next sampling interval corresponds to the rising edges of the SAMPLE pulses. Representative waveforms for $F_S$, $F_R$ and SAMPLE are shown in FIG. 4. It will be understood that it is not necessary to derive SAMPLE from $F_R$, and that SAMPLE may in general be asynchronous with respect to both $F_S$ and $F_R$, and may have a form other than the square wave shown in FIG. 4.

Figure 2:
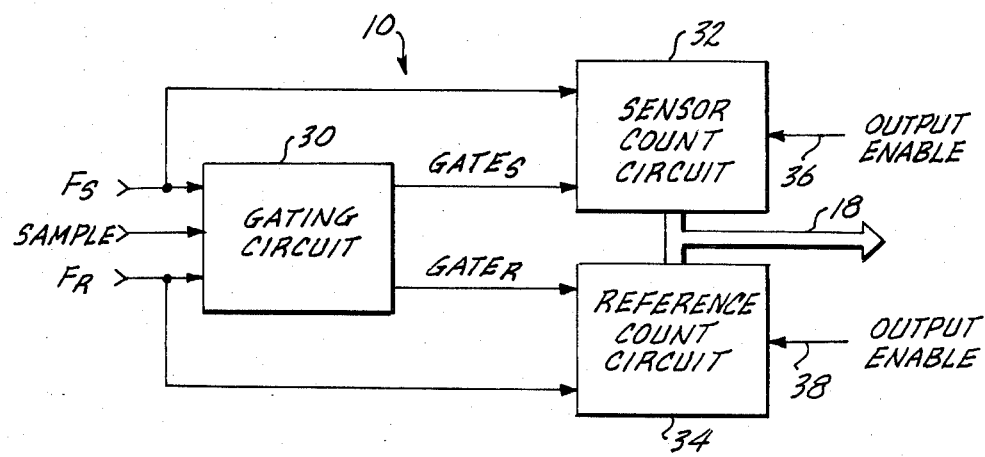
FIG. 2 is a block diagram of a counting circuit according to the present invention.

Referring now to FIG. 2, a preferred embodiment of counting circuit 10 is shown comprising gating circuit 30, sensor count circuit 32, and reference count circuit 34. The sensor signal $F_S$ is input to gating circuit 30 and to sensor count circuit 32. Similarly, reference signal $F_R$ is input to gating circuit 30 and to reference count circuit 34. Gating circuit 30 also receives the SAMPLE signal. Referring again to FIG. 4, time interval $T_1$ is defined to be the interval between successive leading edges of the SAMPLE signal. Gating circuit 30 produces output signals $GATE_S$ and $GATE_R$ that operate to define the time intervals during which cycles of $F_S$ and $F_R$ respectively will be counted. In the illustrated embodiment, $GATE_S$ follows SAMPLE on the falling edges of $F_S$. $GATE_S$ therefore comprises a comparatively low frequency, square wave signal that has a period approximately coextensive with time interval $T_1$. However, $GATE_S$ is shifted in time with respect to the SAMPLE signal such that $GATE_S$ is synchronous with sensor signal $F_S$. In a similar fashion, $GATE_R$ follows $GATE_S$ on the falling edges of $F_R$. $GATE_R$ therefore comprises a comparatively low frequency, square wave signal having a period that is also approximately coextensive with time interval $T_1$. However, $GATE_R$ is shifted in time with respect to the SAMPLE signal such that $GATE_R$ is synchronous with reference signal $F_R$. Thus $GATE_S$ defines a time interval $T_2$ that is approximately coextensive with time interval $T_1$, but that is synchronous with sensor signal $F_S$, and $GATE_R$ defines a time interval $T_3$ that is approximately coextensive with time intervals $T_1$ and $T_2$, but that is synchronous with reference signal $F_R$. In particular, time intervals $T_1$ and $T_2$ are coextensive within $\pm 1$ cycle of $F_S$, and time intervals $T_2$ and $T_3$ are coextensive within $\pm 1$ cycle of $F_R$.

It is to be understood that $GATE_S$ and $GATE_R$ may each comprise one or more separate signals, and may comprise waveforms other than those shown in FIG. 4, so long as the total $GATE_S$ and $GATE_R$ signals have characteristics that are operative to define appropriate time intervals $T_2$ and $T_3$.

Referring again to FIG. 2, sensor count circuit 32 receives signals $F_S$ and $GATE_S$, and responds by counting the number of cycles of $F_S$ that occur during the time interval $T_2$ defined by signal $GATE_S$. In the particular embodiment illustrated, sensor count circuit 32 counts the number of cycles of $F_S$ that occur during each complete cycle of signal $GATE_S$. At each rising edge of $GATE_S$, the current count of $F_S$ cycles is stored, and a new count is commenced. At any convenient time during the succeeding $T_2$ time interval, an output enable signal on line 36 causes sensor count circuit 32 to output the stored count $F_S$ cycles from the previous $T_2$ time interval onto system bus 18. The output enable signal on line 36 may be provided by any convenient means, such as by CPU 20 (FIG. 1).

Reference count circuit 34 operates in a manner similar to sensor count circuit 32. During each time period $T_3$ defined by signal $GATE_R$, reference count circuit 34 counts the number of cycles of reference signal $F_R$. In particular, reference count circuit 34 counts the number of cycles of $F_R$ that occur during each complete cycle of signal $GATE_R$. At each rising edge of $GATE_R$, the current count of $F_R$ cycles is stored, and a new count is begun. The stored count may then by retrieved at any time during the next $T_3$ time interval by providing an output enable signal on line 38. In response to such an output enable signal, reference count circuit 34 places the stored count $F_R$ cycles from the previous $T_3$ time interval onto system bus 18. The output enable signals on line 36 and 38 are of course coordinated so that they occur sequentially rather than simultaneously.

Figure 3:
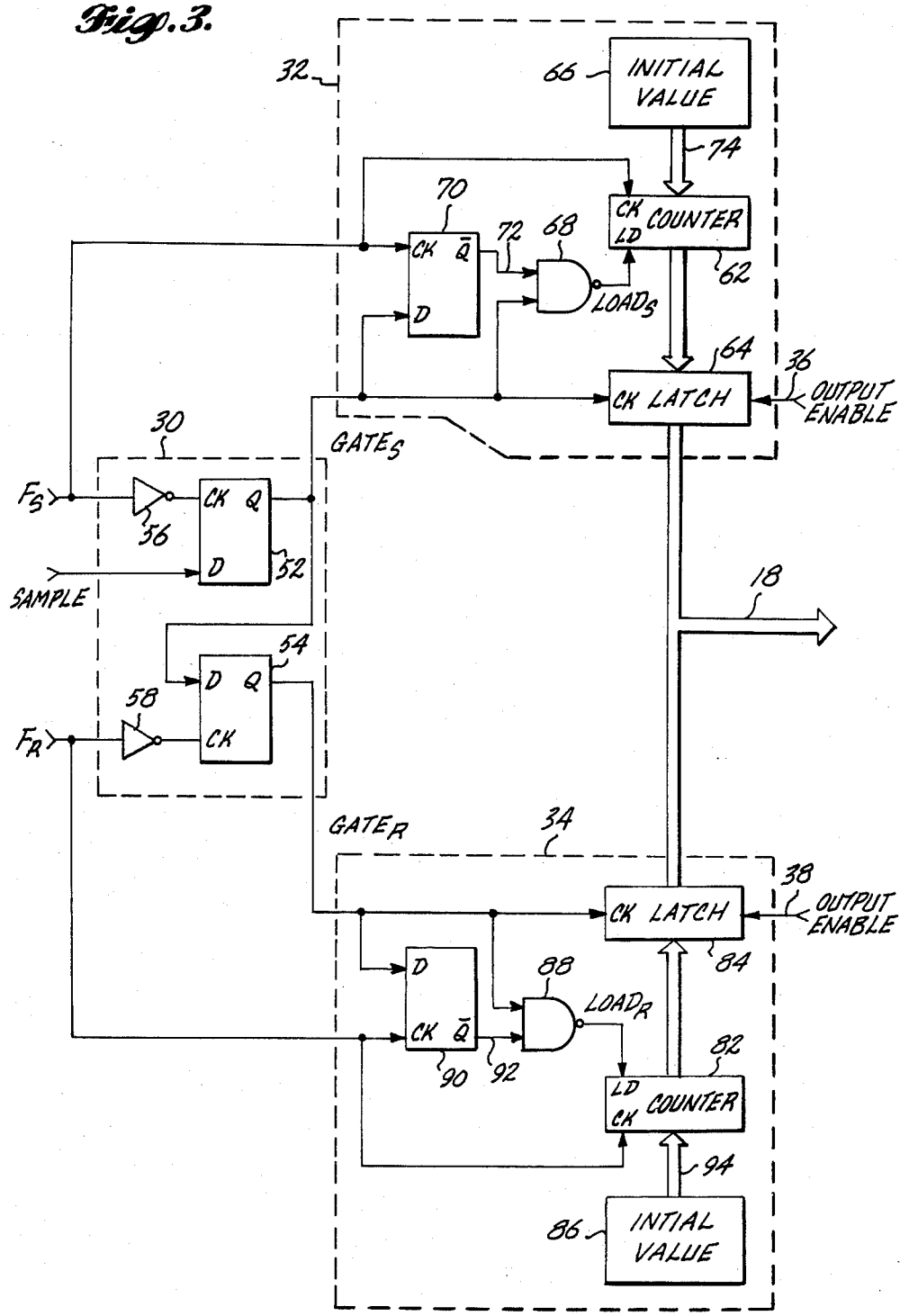
FIG. 3 is a circuit diagram of the counting circuit of FIG. 2.

Referring now to FIG. 3, a detailed embodiment of the present invention is illustrated. Gating circuit 30 comprises flip-flop 52, flip-flop 54, and inverters 56 and 58. Each flip-flop 52 and 54 is operative to transfer the signal (high or low) at its D input to its Q output at each rising edge of the signal at its CK input. As may be appreciated by reference to FIG. 4, the result of the arrangement of flip-flop 52 and inverter 56 is that signal $GATE_S$, produced at the Q output of flip-flop 52, will tend to follow the SAMPLE signal at the D input of flip-flop 52, but $GATE_S$ will only change to follow SAMPLE at the falling edges of $F_S$, such changes occuring at the falling rather than therising edges of $F_S$ due to inverter 56. In a similar manner, flip-flop 54 and inverter 58 will cause $GATE_R$ to follow $GATE_S$, but $GATE_R$ will only change to follow $GATE_S$ at the falling edges of $F_R$. The result of this arrangement will therefore be the wareforms shown in FIG. 4 for SAMPLE, $GATE_S$ and $GATE_R$. Since $F_S$ is asynchronous with respect to SAMPLE, $GATE_S$ will lag SAMPLE by a variable delay which may range from the response time of flip-flop 52 up to one full cycle of $F_S$. Similarly, since $F_R$ is asynchronous with respect to $F_S$, $GATE_R$ will lag $GATE_S$ by a variable delay which may range from the response time of flip-flop 54 up to one full cycle of $F_R$.

Still referring to FIG. 3, sensor count circuit 32 comprises counter 62, latch 64, initial value circuit 66, NAND gate 68 and flip-flop 70. Sensor signal $F_S$ is input directly to the clock input (CK) of counter 62, and counter 62 responds by incrementing an internally stored count at each rising edge of $F_S$. As will be described below, the accumulated count in counter 62 is transferred to latch 64 at the beginning of each time interval $T_2$, and counter 62 is then reinitialized from initial value circuit 66. During the succeeding time interval $T_2$, an output enable signal on line 36 causes latch 64 to place its stored count for the previous $T_2$ time interval onto system bus 18.

The two inputs to NAND gate 68 are $GATE_S$ and the signal on line 72 which originates at the $\overline{Q}$ output of flip-flop 70. The D and CK inputs to filp-flop 70 are $GATE_S$ and $F_S$, respectively. At each rising edge of $F_S$, output $\overline{Q}$ of flip-flop 70 assumes a state (high or low) opposite to that of signal $GATE_S$. Referring to FIG. 4, the result will be that prior to $GATE_S$ going high, signal LOAD$_S$ at the output of NAND gate 68 will be high because one of the NAND inputs (GATE$_S$) is low. The other input to the NAND gate, the signal on line 72, will be high at this time, because several low-to-high transitions of F$_S$ have occurred since GATE$_S$ went low. When GATE$_S$ then goes high at the beginning of time interval T$_2$, the signal on line 72 will remain high until the next rising edge of F$_S$, i.e., for one-half cycle of F$_S$. During this half cycle, both NAND inputs will be high, and the NAND output signal LOAD$_S$ will therefore be low, as indicated in FIG. 4. LOAD$_S$ is input into the load input (LD) of counter 62. Counter 62 is a conventional binary or decade counter that is operative to load the values specified by input value circuit 66 when the LD of the counter goes high. In the embodiment shown in FIG. 3, initial value circuit 66 connects the low order line of bus 74 to a high voltage through an appropriate resistor, and connects all other lines of bus 74 to a low voltage, thus supplying a initial count of +1. Therefore, one-half cycle (of F$_S$) after GATE$_S$ goes high, counter 62 will be loaded with the initial value +1. Counter 62 will then proceed to increment its stored count by 1 each subsequent time that F$_S$ goes high. An initial value of +1 (rather than zero) is supplied to counter 62 because the first low to high transition of F$_S$ occurs one half cycle after GATE$_S$ goes high, at the same time or very slightly before LOAD$_S$ goes high. The first low to high transition of F$_S$ will therefore be missed by counter 62, such missed count being compensated for by the +1 value supplied by initial value circuit 66. At the end of time interval T$_2$, when GATE$_S$ again goes high, the low-to-high transition at the CK input of latch 64 will cause the latch to store the accumulated count in counter 62.

Reference count circuit 34 comprises counter 82, latch 84, initial value circuit 86, NAND gate 88 and flip-flop 90. The operation of the reference count circuit is very similar to that of sensor count circuit 32. Reference signal F$_R$ is input directly to the clock input (CK) of counter 82, and counter 82 responds by incrementing an internally stored count at each rising edge of F$_R$. As will be described below, the accumulated count in counter 82 is transferred to latch 84 at the beginning of each time interval T$_3$, and counter 82 is then reinitialized from initial value circuit 86. During the succeeding time interval T$_3$, an output enable signal on line 38 causes latch 84 to place its stored count for the previous T$_3$ time interval onto system bus 18.

The two inputs to NAND gate 88 are GATE$_R$ and the signal on line 92 which originates at the $\overline{Q}$ output of flip-flop 90. The D and CK inputs to flip-flop 90 are GATE$_R$ and F$_R$, respectively. At each rising edge of F$_R$, output $\overline{Q}$ of flip-flop 90 will assume a state (high or low) opposite to that of signal GATE$_R$. Referring to FIG. 4, the result will be that prior to GATE$_R$ going high, signal LOAD$_R$ at the output of NAND gate 88 will be high, because one of the NAND inputs (GATE$_R$) is low. The other input to the NAND gate, the signal on line 92, will be high at this time, because several low-to-high transitions of F$_R$ have occurred since GATE$_R$ went low. When GATE$_R$ then goes high at the beginning of time interval T$_3$, the signal on line 92 will remain high until the next rising edge of F$_R$, i.e., for one-half cycle of F$_R$. During this half cycle, both NAND inputs will be high, and the NAND output signal LOAD$_R$ will therefore be low, as indicated in FIG. 4. LOAD$_R$ is input into the load input (LD) of counter 82. Counter 82 is a conventional binary or decade counter that is operative to load the values specified by input value circuit 86 when the LD input of the counter goes high. In the embodiment shown in FIG. 3, initial value circuit 86 connects the low order line of bus 94 to a high voltage through an appropriate resistor, and connects all other lines of bus 94 to a low voltage, thus supplying an initial count of +1. Therefore, one-half cycle (of F$_R$) after GATE$_R$ goes high, counter 82 will be loaded with the initial value +1. Counter 82 will then proceed to increment its stored count by 1 each subsequent time that F$_R$ goes high. An initial value of +1 (rather than zero) is supplied to counter 82 because the first low to high transition of F$_R$ occurs one-half cycle after GATE$_R$ goes high, at the same time or very slightly before LOAD$_R$ goes high. The first low to high transition of F$_R$ will therefore be missed by counter 82, such missed count being compensated for by the +1 value supplied by initial value circuit 86. At the end of time interval T$_3$, when GATE$_R$ again goes high, the low-to-high transition at the clock input of latch 84 will cause the latch to store the accumulated count in counter 82.

In an instrument of the general type shown in FIG. 1 in which a conventional counting circuit is used, the resolution of the system generally cannot be improved by averaging the counts or frequencies over a number of sampling intervals. The reason that averaging does not improve resolution is that in conventional counting circuits, the counters are reset at the end of a fixed sampling interval. Since the sensor and reference signals are asynchronous, the result is that partial counts of either the sensor signal or the reference signal are lost. The present invention provides a technique for avoiding the loss of partial counts, allowing a significant improvement in system resolution through averaging.

The advantages of the present invention can be illustrated by means of the following calculations. Let n and m be the number of sensor and reference pulses respectively accumulated for one sampling interval. If f$_s$ and f$_r$ are the frequencies of signals F$_S$ and F$_R$ respectively, then the measured sensor frequency f$_{sm}$ is:

$$f_{sm} = \frac{n}{m} f_r \quad (1)$$

Assuming that f$_r$ is larger than f$_s$, the asynchronous relationship between F$_S$ and F$_R$ means that for each sampling interval, there is an error uncertainty $\Delta m$ in the value of m, with $\Delta m$ being in the range $-1$ to $+1$. The relationship between f$_r$ and the true sensor frequency f$_s$ is therefor:

$$\frac{m + \Delta m}{f_r} = \frac{n}{f_s} \quad (2)$$

By combining equations (1) and (2), one obtains:

$$f_{sm} = \left(1 + \frac{\Delta m}{m}\right) f_s \quad (3)$$

The k-th moment E{$(\Delta m)^k$} of the error $\Delta m$ is given by:

$$E\{(\Delta m)^k\} = \tfrac{1}{2} \int_{-1}^{+1} (\Delta m)^k \, d(\Delta m) \quad (4)$$

since $\Delta m$ has a uniform probability density in the range $-1$ to $+1$. We obtain $E\{\Delta m\}=0$ and $E\{(\Delta m)^2\}=\frac{1}{3}$. If sensor 12 is, for example, an accelerometer for measuring acceleration a, and if there is a linear relationship between acceleration a and frequency $f_s$ such that:

$$a = A_1 f_s + A_0 \qquad (5)$$

then the measured acceleration $a_m$ can be written:

$$a_m = a + \Delta a \qquad (6)$$

where $\Delta a = A_1 f_s \Delta m / m$ is the resolution error due to sampling. Thus the resolution error can be reduced by making m large, i.e., by lengthing the sampling period or by increasing the reference frequency $f_r$. The resolution can also, however, be improved by averaging over several samples. The reason that averaging can improve resolution is that the counting circuit of the present invention does not lose any counts between sampling intervals, and thus, for example, a partial $F_R$ cycle not counted in one sampling interval will be counted during the next sampling interval. The total count for a succession of sampling intervals will therefore be correct, and resolution can be significantly improved by averaging. In the limit of an infinite number of samples to be averaged, the resolution error for the linear sensor modeled by equation 5 will be zero, since:

$$E\{a_m\} = a + \frac{A_1 f_s}{m} E\{\Delta m\} \qquad (7)$$

and $E\{\Delta m\}=0$.

For a nonlinear relationship between acceleration and frequency, such as a quadratic relationship of the form:

$$a = A_1 f_s^2 + A_0 \qquad (8)$$

the resolution error $\Delta a$ in equation (6) becomes:

$$\Delta a = A_1 f_s^2 \left[ \frac{2\Delta m}{m} + \frac{(\Delta m)^2}{m^2} \right] \qquad (9)$$

Since $E\{(\Delta m)^2\}=\frac{1}{3}$, the resolution error for the limiting case of an infinite number of samples will be:

$$E\{\Delta a\} = A_1 f_s^2 \cdot \frac{1}{3m^2} \qquad (10)$$

For most practical instruments, however, the resolution error indicated by equation (10) will be extremely small.

While the preferred embodiments of the invention have been illustrated and described, it should be understood that variations will become apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. An apparatus for counting the number of cycles of a sensor signal and of a reference signal that occur during respective time intervals associated with a sampling interval defined by a sample signal, whereby the relationship of the frequency of the sensor signal to the frequency of the reference signal may be determined, the apparatus comprising:

gating means responsive to the sample signal and to the sensor and reference signals for producing a sensor gate signal and a reference gate signal, the sensor gate signal having a characteristic thereof that is operative to define a sensor interval that begins and ends synchronously with respect to the sensor signal, the reference gate signal having a characteristic thereof that is operative to define a reference interval that begins and ends synchronously with respect to the reference signal, the sensor, reference and sampling intervals being approximately coextensive with one another;

sensor count means for counting the number of cycles of the sensor signal that occur during the sensor interval; and reference count means for counting the number of cycles of the reference signal that occur during the reference interval.

2. The apparatus of Claim 1, wherein the sample signal has a characteristic thereof that is operative to define a plurality of successive fixed length sampling intervals, and wherein the gating means, the sensor count means and the reference count means are operative to perform their respective functions for each of the successive sampling intervals, whereby the cycles of the sensor signal and the cycles of the reference signal are counted during time intervals associated with each successive sampling interval.

3. The apparatus of claim 2, wherein the successive sampling intervals immediately follow one another, and wherein the gating means produces the sensor and reference gate signals for successive sampling intervals such that the end of the sensor interval associated with one sampling interval coincides with the beginning of the sensor interval associated with the next sampling interval, and the end of the reference interval associated with one sampling interval coincides with the beginning of the reference interval associated with the next sampling interval.

4. The apparatus of claim 1, wherein the gating means is operative to cause the sensor interval to commence at the beginning of the first cycle of the sensor signal that occurs after the beginning of the sampling interval, and to end at the beginning of the first cycle of the sensor signal that occurs after the end of the sampling interval.

5. The apparatus of claim 1, wherein the gating means is operative to cause the reference interval to commence at the beginning of the first cycle of the reference signal that occurs after the beginning of the sensor interval, and to end at the beginning of the first cycle of the reference signal that occurs after the end of the sensor interval.

6. A method for counting the number of cycles of a sensor signal and a reference signal that occur during respective time intervals associated with a sampling interval defined by a sample signal, whereby the relationship of the frequency of the sensor signal to the frequency of the reference signal may be determined, the method comprising:

producing a sensor gate signal and a reference gate signal in response to the sample signal and to the sensor and reference signals, the sensor signal having a characteristic thereof that is operative to define a sensor interval that begins and ends synchronously with respect to the sensor signal, the reference gate signal having a characteristic thereof that is operative to define a reference interval that begins and ends synchronously with respect to the reference signal, the sensor, reference and sampling intervals being approximately coextensive with one another;

counting the number of cycles of the sensor signal that occur during the sensor interval; and counting the number of cycles of the reference signal that occur during the reference interval.

7. The method of claim 6, wherein the sample signal has a characteristic thereof that is operative to define a plurality of successive fixed length sampling intervals, wherein the sensor and reference gate signals are produced for each successive sampling interval to define respective sensor and reference intervals associated with each successive sampling interval, and wherein the cycles of the sensor and reference signals are counted during the respective sensor and reference intervals associated with each successive sampling interval.

8. The method of claim 7, wherein the successive sampling intervals immediately follow one another, wherein the sensor and reference gate signals are produced such that for successive sampling intervals, the end of the sensor interval associated with one sampling interval coincides with the beginning of the sensor interval associated with the next sampling interval, and the end of the reference interval associated with one sampling interval coincides with the beginning of the reference interval associated with the next sampling interval.

9. The method of claim 6, wherein the sensor interval commences at the beginning of the first cycle of the sensor signal that occurs after the beginning of the sampling interval, and ends at the beginning of the first cycle of the sensor signal that occurs after the end of the sampling interval.

10. The method of claim 6, wherein the reference interval commences at the beginning of the first cycle of the reference signal that occurs after the beginning of the sensor interval, and ends at the beginning of the first cycle of the reference signal that occurs after the end of the sensor interval.

11. An apparatus for measuring an input variable comprising:
(a) a sensor for producing a sensor signal, the frequency of the sensor signal corresponding to the value of the input variable;
(b) means for producing a periodic reference signal;
(C) means for producing a sample signal that is operative to define a sampling interval;
(d) counting means for counting the number of cycles of the sensor signal and of the reference signal that occur during respective time intervals associated with the sampling interval, the counting means further comprising:
  (1) gating means responsive to the sample signal and to the sensor and reference signals for producing a sensor gate signal and a reference gate signal, the sensor gate signal having a characteristic thereof that is operative to define a sensor interval that begins and ends synchronously with respect to the sensor signal, the reference gate signal having a characteristic thereof that is operative to define a reference interval that begins and ends synchronously with respect to the reference signal, the sensor, reference and sampling intervals being approximately coextensive with one another;
  (2) sensor count means for counting the number of cycles of the sensor signal that occur during the sensor time interval and for producing a corresponding digital sensor count signal;
  (3) reference count means for counting the number of cycles of the reference signal that occur during the reference time interval and for producing a corresponding digital reference count signal; and
(e) processor means for receiving the sensor and reference count signals and determining therefrom the value of the input variable.

12. The apparatus of claim 11, wherein the sample signal has a characteristic thereof that is operative to define a plurality of successive fixed length sampling intervals, and wherein the gating means, the sensor count means and the reference count means are operative to perform their respective functions for each of the successive sampling intervals, whereby a sensor count signal and a reference count signal are produced for each successive sampling interval.

13. The apparatus of claim 12, wherein the successive sampling intervals immediately follow one another, wherein the gating means produces the sensor and reference gate signals for successive sampling intervals such that the end of the sensor interval associated with one sampling interval coincides with the beginning of the sensor interval associated with the next sampling interval, and the end of the reference interval associated with one sampling interval coincides with the beginning of the reference interval associated with the next sampling interval.

14. The apparatus of claim 13, wherein the processor means is operative to average values associated with the sensor and reference count signals for said successive sampling intervals, to thereby determine the value of the input variable over time.

15. The apparatus of claim 11, wherein the gating means is operative to cause the sensor interval to commence at the beginning of the first cycle of the sensor signal that occurs after the beginning of the sampling interval, and to end at the beginning of the first cycle of the sensor signal that occurs after the end of the sampling interval.

16. The apparatus of claim 11, wherein the gating means is operative to cause the reference interval to commence at the beginning of the first cycle of the reference signal that occurs after the beginning of the sensor interval, and to end at the beginning of the first cycle of the reference signal that occurs after the end of the sensor interval.

* * * * *

UNITED STATES PATENT AND TRADEMARK OFFICE
CERTIFICATE OF CORRECTION

PATENT NO. : 4,541,105
DATED : September 10, 1985
INVENTOR(S) : Rex B. Peters et al.

It is certified that error appears in the above-identified patent and that said Letters Patent is hereby corrected as shown below:

Column 3, line 12, "corresponds" should be --correspond--
Column 4, line 35, "therising" should be --the rising--
line 40, "wareforms" should be --waveforms--
line 64, "filp-flop" should be --flip-flop--

Column 6, line 66, "$E\ (\Delta m)^k = \frac{1}{2} \quad {}_{-1}^{+1} (\Delta m)^k\ d(\Delta m)$" (Equation (4))

should be $$--E\ (\Delta m)^k = \frac{1}{2} \int_{-1}^{+1} (\Delta m)^k\ d(\Delta m)--$$

Claim 6, line 10, insert --gate-- after "sensor" (second occurrence)
Claim 11, line 7, "C" should be --c--

*Signed and Sealed this*

*Nineteenth* Day of *November 1985*

[SEAL]

*Attest:*

DONALD J. QUIGG

*Attesting Officer*  *Commissioner of Patents and Trademarks*